(12) United States Patent
Anderson et al.

(10) Patent No.: US 6,646,505 B2
(45) Date of Patent: Nov. 11, 2003

(54) POWER AMPLIFIER ARRAY WITH SAME TYPE PREDISTORTION AMPLIFIER

(75) Inventors: Dale Anderson, Colleyville, TX (US); Michael Shaw, El Dorado Hills, CA (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/106,462

(22) Filed: Mar. 26, 2002

(65) Prior Publication Data

US 2003/0184371 A1 Oct. 2, 2003

(51) Int. Cl.[7] .................................. H03F 3/45
(52) U.S. Cl. ................... 330/124 R; 330/144; 330/149; 325/297; 455/63
(58) Field of Search .................. 330/124 R, 144, 330/149, 295; 375/297; 455/63; 257/528

(56) References Cited

U.S. PATENT DOCUMENTS

| | | | | |
|---|---|---|---|---|
| 5,570,063 | A | | 10/1996 | Eisenberg .................. 330/149 |
| 5,578,860 | A | * | 11/1996 | Costa et al. ................ 257/528 |
| 5,850,162 | A | * | 12/1998 | Danielsons ................. 330/149 |
| 6,504,428 | B2 | * | 1/2003 | Cova et al. .................. 330/52 |
| 6,522,197 | B2 | * | 2/2003 | Nam et al. .................. 330/149 |

FOREIGN PATENT DOCUMENTS

EP          441579       *  8/1991

OTHER PUBLICATIONS

Madani "Reducing the Intermodulation Distortion in Multi-Carrier Microwave Power Amplifiers" IEEE 1999 Symposium on High Performance Electron Devices for Microwave and Optoelectronic Applications pp 153–157.*

* cited by examiner

*Primary Examiner*—Michael B Shingleton
(74) *Attorney, Agent, or Firm*—Posz & Bethards, PLC; Charles W. Bethards

(57) ABSTRACT

A power amplifier circuit (30, 60) improves the linearity of an amplified output signal. The power amplifier circuit (30, 60) includes an input (33, 63) for receiving a carrier signal (34, 64) and an array of combined amplifiers (32, 62) of a predetermined type for amplifying the carrier signal (34, 64). At least one amplifier (48, 78) of the predetermined type is located between the input (33, 63) and the array of combined amplifiers (32, 62) for amplifying the carrier signal (34, 64) to produce a predistorted carrier signal (34$b1$, 64$b1$) with a carrier signal component and a distortion component to condition the carrier signal (34, 64) for input into the array of combined amplifiers (32, 62), and specifically to compensate for nonlinearities produced by the array of combined amplifiers (32, 62).

20 Claims, 6 Drawing Sheets

POWER AMPLIFIER ARRAY WITH SAME TYPE PREDISTORTION AMPLIFIER

BACKGROUND OF THE INVENTION

1. Field of the Invention

The present invention relates to power amplifiers, and specifically to a power amplifier circuit including a predistortion amplifier that is of the same type as amplifiers in an amplifier array and that improves the linearity of a signal amplified by the array.

2. Description of Related Art

High power amplifier circuits used to amplify modulated signals in, for example, wireless communications base stations often are designed to create a certain amount of predistortion to compensate for distortion generated by the signal amplifier. Typically, an input modulated signal will be split into two signal components, with one signal component being conditioned to match input power requirements of the signal amplifier, and the other signal component being predistorted before being re-combined with the first component. When the resulting re-combined signal is input into the signal amplifier, the predistortion helps to compensate for nonlinearities added to the resulting amplified signal due to, for example nonlinear transconductance (if a FET device is used) and junction capacitance and the saturation effects of the amplifier that result in signal clipping.

Conventionally, devices such as diodes are used to predistort the above-discussed first signal component as such devices are efficient and therefore use minimal power. However, it is difficult at best to match the predistortion with the amplifier-generated distortion because the predistortion and distortion are generated by dissimilar component characteristics and nonlinear mechanisms. To generate a more accurate distortion match, feedforward amplifier techniques can be employed, where expensive error amplifiers must be implemented to process the signal amplifier distortion.

Digital predistortion may alternatively be used in place of the above analog predistortion. However, the additional components necessary for signal feedback as well as the resulting power dissipation increase when compared to analog predistortion solutions, and the characteristic limited bandwidth of correction make such an option impractical in most circuit design situations that have nonlinearities higher than fifth order.

BRIEF DESCRIPTION OF THE DRAWINGS

Objects and advantages of the present invention will be more readily apparent from the following detailed description of preferred embodiments thereof when taken together with the accompanying drawings in which.

DETAILED DESCRIPTION OF THE PREFERRED EXEMPLARY EMBODIMENTS

Figure 1:
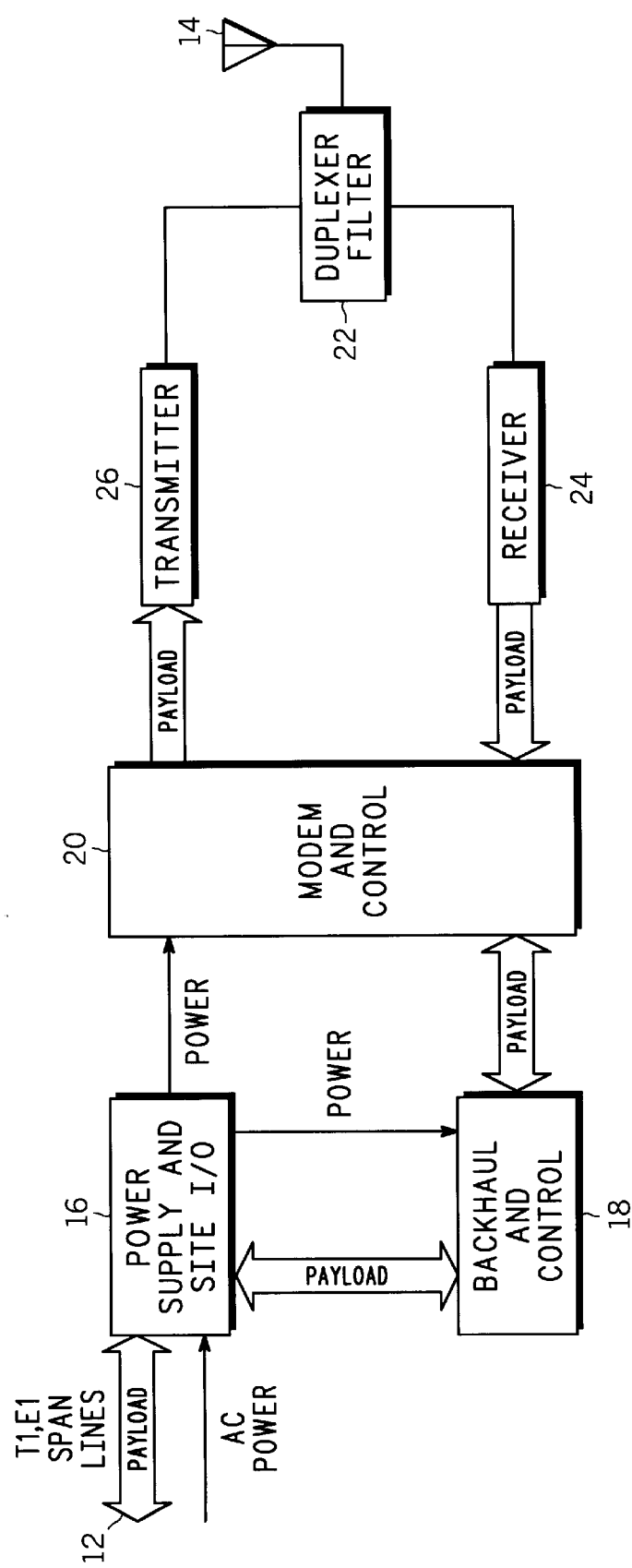
FIG. 1 is a block diagram of an exemplary wireless communications base station in which a power amplifier circuit according to the present invention may be implemented.

Referring now to the drawings in which like numerals reference like parts, FIG. 1 shows an exemplary wireless communications base station (base station) 10. While the actual structural makeup of such a base station will vary, the base station 10 will be referred to for purposes of discussing an exemplary environment in which various embodiments of a power amplifier circuit according to the present invention may be implemented.

As is well known, the base station 10 is generally coupled to a landline link such as, for example, T1 or E1 span lines 12 that enable the base station 10 to connect wireless communications received by a base station antenna 14 to the public switch (not shown) and vice versa. The base station 10 generally includes a power supply for converting AC power to and providing appropriate DC power to the various elements of the base station and a site input/output processor shown generally at 16 for facilitating input/output with a backhaul and control computer 18. The backhaul and control computer 18 is for controlling and processing communications over the span lines 12 as well as communications with and operation of a modem and control computer 20. The modem and control computer 20 is for facilitating receipt, transmission and processing of communications signals from a base station receiver 24 and for a base station transmitter 26 that are inter-coupled through a duplexer 22 to the base station antenna 14. The base station transmitter 26, preferably, includes, implements, and utilizes a preferred embodiment of a power amplifier circuit according to the present invention.

Figure 2:
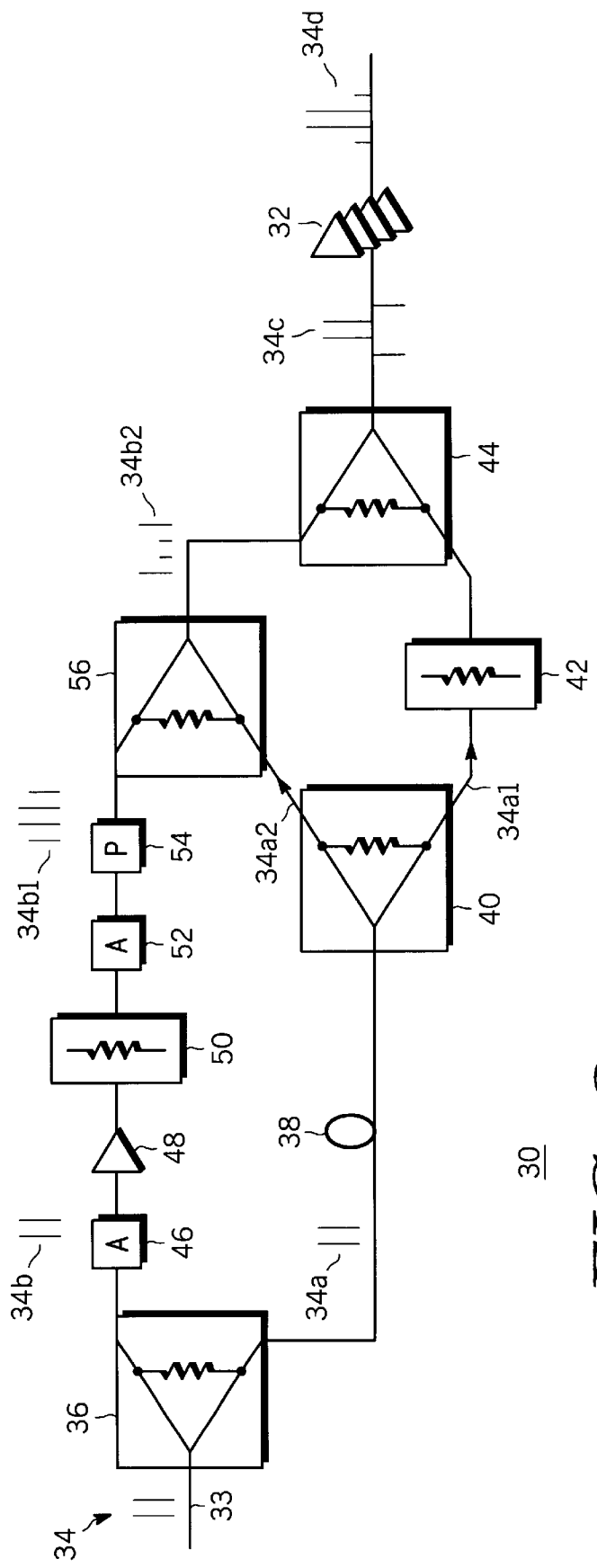
FIG. 2 is a block diagram of a power amplifier circuit according to a first exemplary embodiment of the present invention.

FIG. 2 shows a first exemplary embodiment of a power amplifier circuit 30 according to the present invention. As will be discussed below in detail, the power amplifier circuit 30 includes an amplifier array 32 of N combined amplifiers (N being a positive integer of at least 1) that are preferably combined in parallel and that are each of a predetermined type such as, for example multi-stage GaAs RFICs manufactured by Raytheon Corporation. However, any array of parallel-combined amplifiers may be used. In addition, the amplifier array 32 may include amplifier stages preceding the paralleled devices to provide proper signal drive level for the paralleled devices. The power amplifier circuit 30 is capable of linearly amplifying any carrier signal independent of the modulation and type of signal. However, it is contemplated that the power amplifier circuit 30 may be utilized in a base station such as the base station 10 to linearly amplify single or multiple carrier signals such as, for example, CDMA, GSM or any like communications signals independent of the particular air interface. While the power amplifier circuit 30 may be implemented in a base station such as the base station 10 in FIG. 1 to produce a linear amplified carrier signal in the range of, for example, 30–40 W, such a configuration may be alternatively implemented using IC packages or discrete device amplifiers to amplify signals on a much smaller scale, in, for example, applications such as cellular handsets or WLANs that require amplified output carrier signals of about 1 W or less.

The power amplifier circuit 30 includes an input 33 for receiving a carrier signal 34 of the type discussed above and depicted here as two tones. A power splitter 36, which may be, for example, a hybrid combiner such as a Wilkinson combiner, a coupler such as a 3 dB, 10 dB or 20 dB coupler, or any other passive linear time invariant multi-port device designed to split power among its ports, splits the input carrier signal 34 into a first signal component, referred to hereinafter as a clean signal component 34a, for transmission on a clean signal path, and a not necessarily equal power-second signal component, referred to hereinafter as a predistorted signal component, 34b for transmission on a predistortion signal path.

The clean signal component 34a is delayed via a delay 38, which may be, for example, a predetermined length of coaxial cable or a high Q filter, and which has an associated delay and loss that each depend upon the delay and loss in the predistorted signal component path caused by phase shifting, attenuating, and amplifying devices. The delayed clean signal component 34a is then split by a passive splitter/combiner 40 into not necessarily equal power clean signal sub-components 34a1 and 34a2. An attenuator 42 then attenuates the clean signal sub-component 34a1. The attenuator 42 reduces the amplitude of the clean signal sub-component 34a1 by, for example, 6 dB to adjust the power level of the clean signal sub-component 34a1 to a level that is acceptable at an input of the amplifier array 32. Subsequently, the clean signal sub-component 34a1 is then input into a carrier re-insertion passive combiner 44 for reasons discussed below in more detail.

Still referring to FIG. 2, the signal component 34b subsequent to being split by the power splitter 36 is passively attenuated by an attenuator 46 based on an input control voltage set, for example, by an operator at a test bench during circuit assembly. The signal component 34b is then predistorted by at least one predistortion amplifier 48 to produce a predistorted signal component 34b1. The exemplary component of the predistorted signal component 34b1 shown in FIG. 2 includes $3^{rd}$ order nonlinearity signal components, as such components fall close to the carrier signal and are typically of primary concern in such an application. However, it should be appreciated that the power amplifier circuit 30 may be configured to address other higher order odd mode nonlinearities such as $5^{th}$ order nonlinearities in a similar manner. Further, although only one predistortion amplifier is shown in FIG. 2 for purposes of illustration and discussion, it is contemplated that any number of predistortion amplifiers could be combined in parallel to predistort the signal component 34b. For example, if a multi-chip configuration of, for example, 128 combined amplifiers is used to form the amplifier array 32, it is conceivable that, for example, a chip of 8 combined amplifiers may be utilized to implement the predistortion amplifier 48. Regardless, the predistortion amplifier 48 is of the same type as each of the individual amplifiers in the amplifier array 32. The amplifier circuit 30 utilizes the fact that the predistortion amplifier 48 is of the same predetermined type as the amplifiers in the amplifier array 32 to create the same proportional amount of distortion as the amplifier array 32 and to use a proportional amount of power. As a result, predistortion can be more easily matched to distortion of amplifier array 32 without additional circuit components and signal processing.

The resulting predistorted signal component 34b1 is attenuated by a fixed attenuator 50, such as a 20 dB pad, to reduce the power level of the predistorted signal component 34b1 before it is input into a passive gain adjuster, such as an attenuator, 52 and a phase adjuster 54. The passive gain adjuster 52 reduces the level of the carrier signal by, for example 6 dB to adjust the level of the carrier signal to a level corresponding to a required input level at the phase adjuster 54. The phase adjuster 54, which is of a type well known in the art, phase shifts the predistorted signal component 34b1 by 180° relative to the clean sub-component 34a2 so that, when the predistortion signal component 34b1 is combined by a passive splitter/combiner 56 with the clean signal sub-component 34a2, the carrier signal is canceled to leave only an inverted distortion signal 34b2. The inverted distortion signal 34b2 is then combined with the clean carrier signal sub-component 34a1 by the carrier re-insertion splitter/combiner 44 to produce a resulting signal 34c including both the clean carrier signal sub-component 34a1 and the inverted distortion signal 34b2. The amplifier array 32 then amplifies the signal 34c and outputs a resulting linearized amplified signal 34d.

Figure 3:
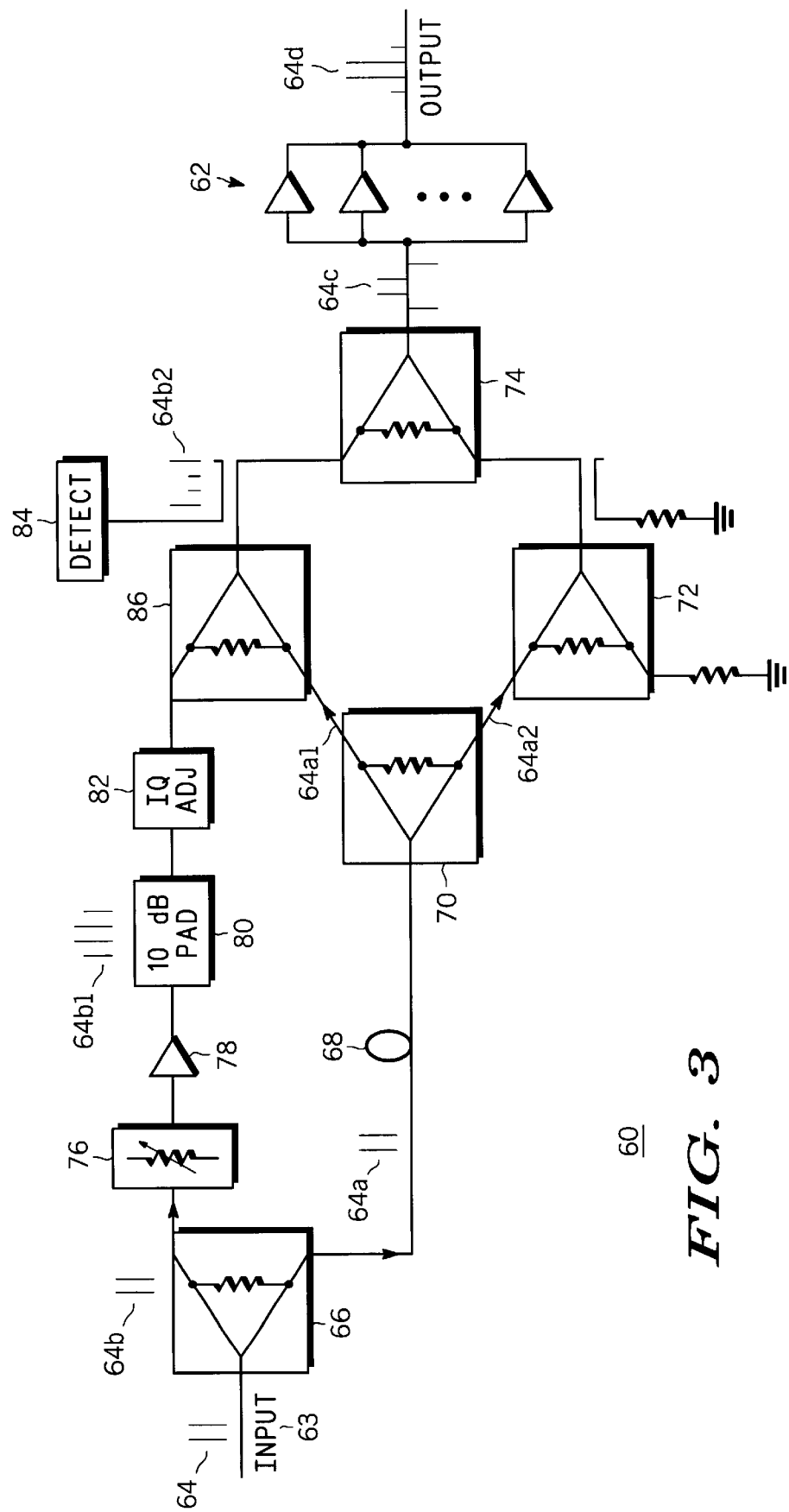
FIG. 3 is a block diagram of a power amplifier circuit according to a second exemplary embodiment of the present invention.

FIG. 3 shows a second exemplary embodiment of a power amplifier circuit 60 according to the present invention. The power amplifier 60 achieves the same results as the power amplifier circuit 30 but with a slightly different circuit configuration. Specifically, the power amplifier circuit 60 performs phase and gain adjusting on the predistorted signal component 64b1 using a vector IQ modulator 82 in place of the separate attenuator 52 and phase shifter 54 in the power amplifier circuit 30.

As with the above-discussed first exemplary embodiment, the power amplifier circuit 60 includes an amplifier array 62 of N combined amplifiers (N being a positive integer >1) that are preferably combined in parallel and that are each of a predetermined type such as, for example GaAs RFICs manufactured by Raytheon Corporation. The amplifier circuit 60 is capable of linearly amplifying any carrier signal independent of the modulation and type of signal. However, as with the power amplifier circuit 30 in FIG. 1, it is contemplated that the power amplifier circuit 60 may be utilized in a base station such as the base station 10 to linearly amplify carrier signals such as, for example, CDMA, GSM or any like communications signals independent of the particular air interface.

The power amplifier circuit 60 includes an input 63 for receiving a carrier signal 64 of the type as discussed above. A first power splitter/combiner 66, which may be, for example, a type as discussed above in connection with the power splitter/combiner 36, splits the input carrier signal 64 into a first signal component, referred to hereinafter as a clean signal component, 64a, for transmission on a clean signal path, and a not necessarily equal power second signal component, referred to hereinafter as a predistorted signal component, 64b for transmission on a predistortion signal path.

The clean signal component 64a is delayed via a delay 68, which, as with the delay 38 in FIG. 2, may be, for example, a predetermined length of coaxial cable or a high Q filter, and which has an associated delay and loss that each depend upon the delay characteristics of components in the predistorted signal component path discussed below. The delayed clean signal component 64a is then split by a second passive splitter/combiner 70 into not necessarily equal power clean signal sub-components 64a1 and 64a2. The clean signal sub-component 64a2 is attenuated by, for example, a third passive splitter/combiner 72 that acts effectively as a 3 dB attenuator. Alternatively, a 3 dB pad rather than the third passive splitter/combiner 72 may be used to reduce the power of the clean signal sub-component 64a1. The attenuated clean signal sub-component 64a1 is then input into a carrier re-insertion passive splitter/combiner 74 similar to the carrier re-insertion passive splitter/combiner 44 shown in FIG. 2.

Still referring to FIG. 3, the predistorted signal component 64b is attenuated by a dynamic attenuator 76 to maintain input signal power into a predistortion amplifier 78 at the same proportional level as the input power into the individual paralleled amplifiers that are combined in the amplifier array 62. The predistorted signal component 64b is then predistorted by at least one predistortion amplifier 78. As with the predistorted signal component 34b1 shown in FIG. 2, the exemplary component of the predistorted signal component 64b1 is shown with $3^{rd}$ order nonlinearity signal components, as such components fall close to the carrier signal and are typically of primary concern in such an application. However, it should be appreciated that the power amplifier circuit 60 may be configured to compensate for other higher order odd mode nonlinearities such as $5^{th}$ order nonlinearities in a similar manner. Also as in FIG. 2, it is contemplated that any number of predistortion amplifiers may be combined in parallel to predistort the predistorted signal component 64b. The predistortion amplifier 78 is of the same type as each of the individual amplifiers in the amplifier array 62. As with the amplifier circuit 30, the amplifier circuit 60 utilizes the fact that the predistortion amplifier 78 is of the same predetermined type as the amplifiers in the amplifier array 62 to create the same proportional amount of distortion as the amplifier array 32 and to use a proportional amount of power. As a result, predistortion can be more easily matched to distortion without additional circuit components and signal processing.

Once the predistortion amplifier 78 outputs the predistorted signal component 64b1, it is attenuated by a fixed attenuator 80, such as a 10 dB pad, and its power level is therefore reduced before it is input into an IQ vector modulator 82 referred to hereinafter as an IQ adjuster. The IQ adjuster 82 adjusts the phase by 180 degrees and the gain of the carrier signal and the distortion signal of the predistorted signal component 64b1 to provide an inverted predistorted signal component to a fifth passive splitter/combiner 86. A detect processor 84, which is preferably a RMS power detector is coupled to the output of the passive splitter/combiner 86 and controls the IQ adjuster 82 to minimize the amount of an inverted distortion signal component 64b2 at that output.

The fifth passive splitter/combiner 86 re-combines the predistorted signal component 64b1 after it is output in inverted form from the IQ adjuster 82, with the clean signal sub-component 64a2 to cancel the carrier signal and thereby leave only the inverted distortion signal component 64b2. The inverted distortion signal component 64b2 is then combined with the clean carrier signal sub-component 64a1 by the carrier re-insertion splitter/combiner 74 to produce a resulting signal 64c including both the clean carrier signal sub-component 64a1 and the inverted distortion signal component 64b2. The resulting signal 64c is then input into and amplified by the amplifier array 62, and the amplifier array 62 outputs a resulting linearized amplified signal 64d.

Figure 4:
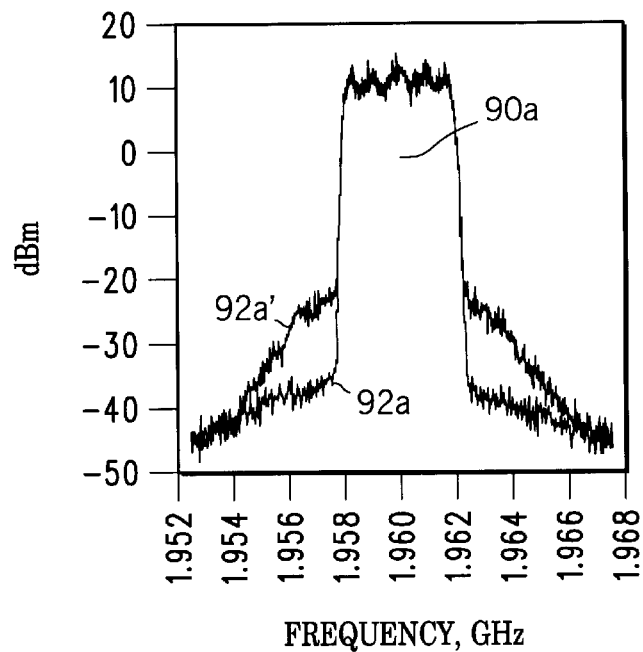
FIGS. 4–6 are graphical illustrations of output versus frequency for a power amplifier circuit according to the present invention in which the amplifier array includes four combined amplifier devices.
Figure 5:
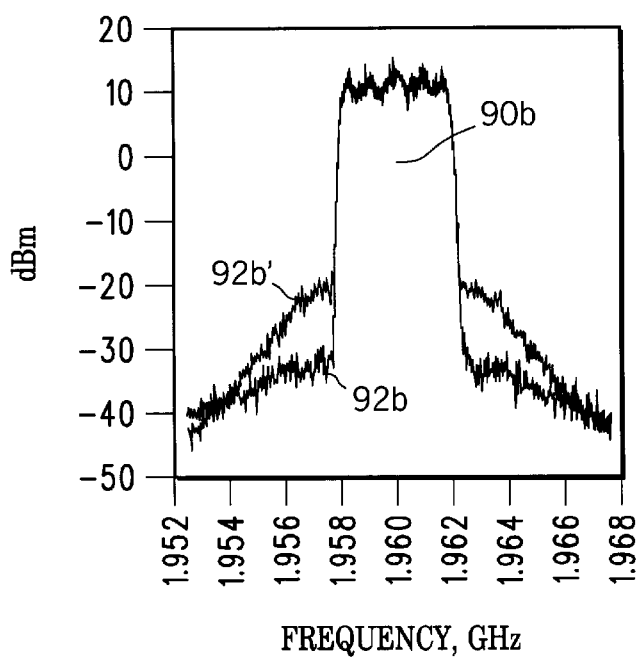
Figure 6:
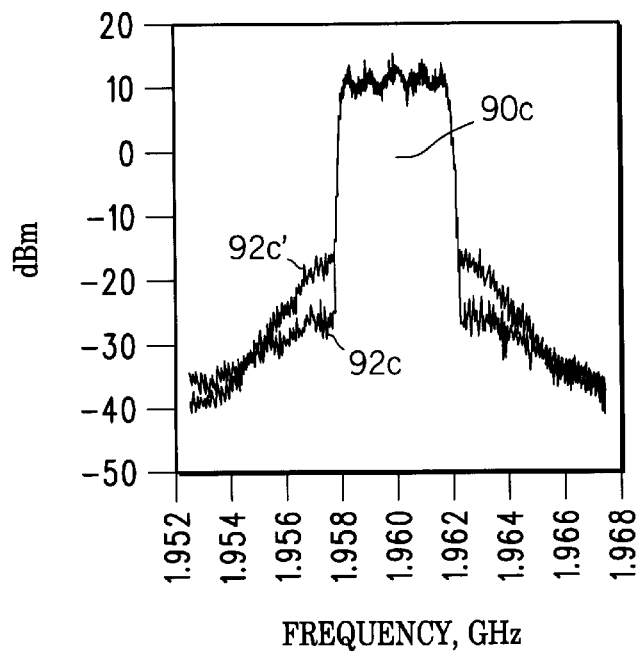

FIGS. 4–6 graphically illustrate the improvement in performance of a power amplifier circuit utilizing an amplifier array and a same type predistortion amplifier according to, for example, either of the above exemplary embodiments as compared to an amplifier array without predistortion. Specifically, the results shown were generated by amplification of a 3.84 Mcps 32-channel WCDMA signal by a power amplifier circuit with an array of four Raytheon GaAs RFICs, each having a gain of approximately 30 dB and a single Raytheon GaAs RFIC as the predistortion amplifier.

In FIG. 4, when a power amplifier circuit, including an amplifier array and a same type predistortion amplifier as discussed above, was driven at a power output of $P_{out}$=35 dBm, it operated at a corresponding array efficiency of 14% and output an amplified carrier signal 90a with zonal splatter 92a, representing that component of the carrier signal splattering outside of the carrier first order bandwidth. When the same power amplifier circuit was driven at a power output of $P_{out}$=35 dBm but without the predistortion amplifier, it operated at the same array efficiency of 14% but output a significantly higher amount of zonal splatter 92a'.

In FIG. 5, when the same power amplifier circuit was driven at a power output of $P_{out}$=36 dBm, it operated at a corresponding array efficiency of 17% and output an amplified carrier signal 90b and zonal splatter 92b. When the same power amplifier circuit was driven at a power output of $P_{out}$=36 dBm but without the predistortion amplifier, it operated at the same array efficiency of 17% but again output a significantly higher amount of zonal splatter 92b'.

In FIG. 6, when the same power amplifier circuit was driven even harder at a power output of $P_{out}$=37 dBm, it operated at an even greater array efficiency of 19% and output an amplified baseband carrier signal 90c and zonal splatter 92c. When the same power amplifier circuit was driven at a power output of $P_{out}$=37 dBm but without the predistortion amplifier, it operated at the same array efficiency of 19% but again output a significantly higher amount of zonal splatter 92c'.

Figure 7:
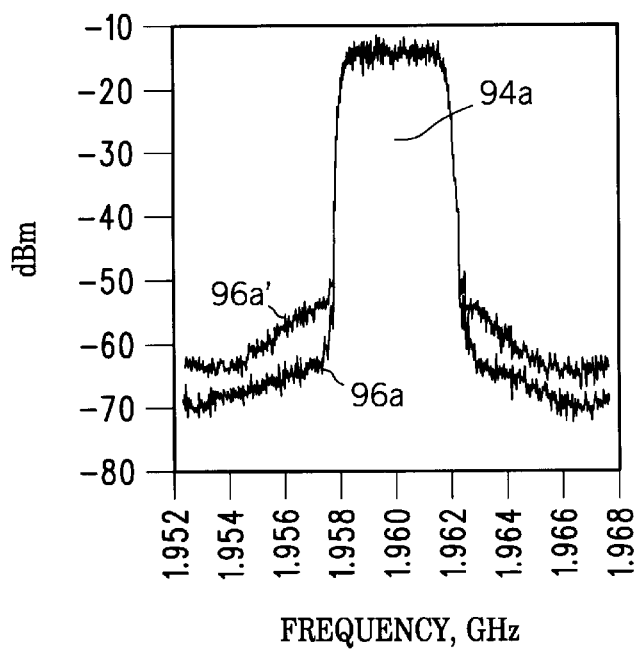
FIGS. 7–9 are graphical illustrations of output versus frequency for a power amplifier circuit according to the present invention in which the amplifier array includes thirty-two combined amplifier devices.
Figure 8:
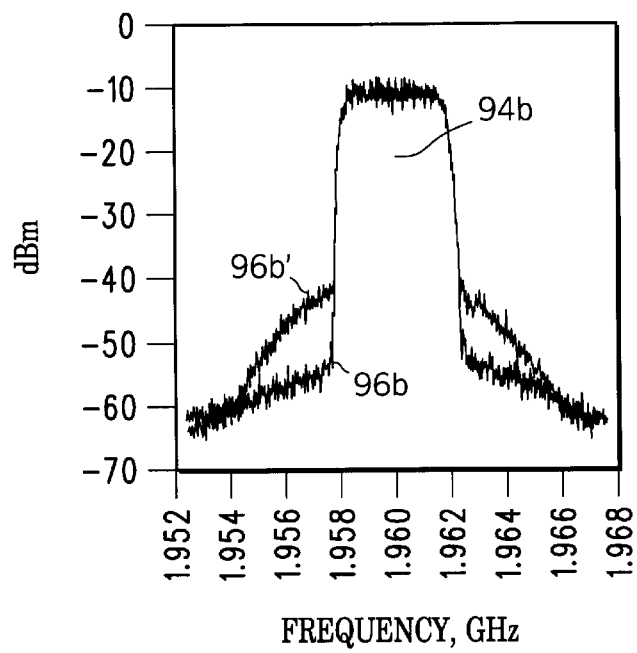
Figure 9:
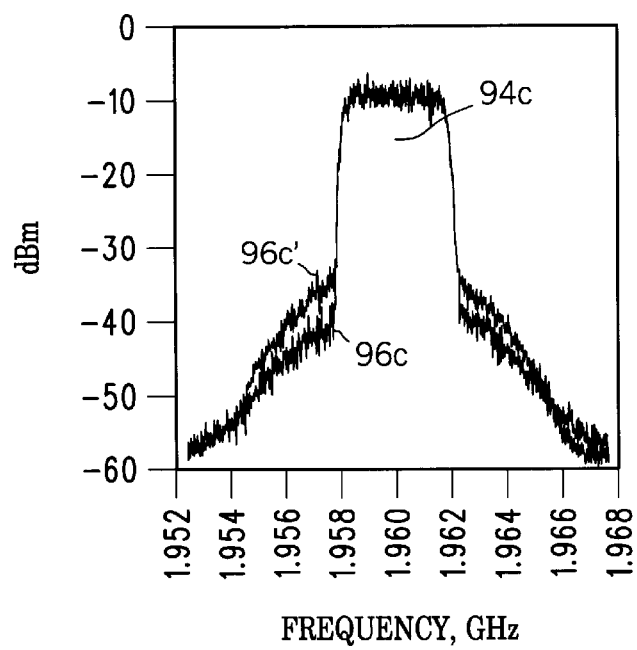

FIGS. 7–9 graphically illustrate the improvement in performance of another power amplifier circuit utilizing an amplifier array of thirty-two combined Raytheon GaAs RFICs, each having a gain of approximately 30 dB, and a single Raytheon GaAs RFIC as the predistortion amplifier to amplify the exemplary 3.84 Mcps 32-channel WCDMA signal.

In FIG. 7, when the same power amplifier circuit was driven at a power output of $P_{out}$=40 dBm, it operated at a corresponding array efficiency of 6% and output an amplified carrier signal 94a and zonal splatter 96a. When the same power amplifier circuit was driven at a power output of $P_{out}$=40 dBm but without the predistortion amplifier, it operated at the same array efficiency of 6% but output a significantly higher amount of zonal splatter 96a'.

In FIG. 8, when the same power amplifier circuit was driven at a power output of $P_{out}$=43 dBm, it operated at a corresponding array efficiency of 10.2% and output an amplified carrier signal 94b and zonal splatter 96b. When the same power amplifier circuit was driven at a power output of $P_{out}$=43 dBm but without the predistortion amplifier, it operated at the same array efficiency of 10.2% but output a significantly higher amount of zonal splatter 96b'.

In FIG. 9, when the same power amplifier circuit was driven even harder at a power output of $P_{out}$=45 dBm, it operated at a corresponding array efficiency of 14.1% and output an amplified carrier signal 94c and zonal splatter 96c. When the same power amplifier circuit was driven at a power output of $P_{out}$=45 dBm but without the predistortion amplifier, it operated at the same array efficiency of 14.1% but output a significantly higher amount of zonal splatter 96c'.

One skilled in the art will appreciate that the above figures show that power amplifier circuits of the type according to the present invention are capable of being driven harder to provide more power when necessary while still maintaining the same linearity. Put another way, the power amplifier circuit configuration of the present invention enables system designers to use one or more same-type predistortion amplifiers, and therefore combine more amplifiers in an amplifier array, to increase output power capabilities of the circuit and at the same time maintain, or increase, the circuit's linearity and efficiency parameters.

While the above description is of the preferred embodiment of the present invention, it should be appreciated that the invention may be modified, altered, or varied without deviating from the scope and fair meaning of the following claims.

What is claimed is:

1. A power amplifier circuit, comprising:
   an input for receiving a carrier signal;
   an array of combined amplifiers of a predetermined type for amplifying the carrier signal;
   at least one amplifier of the predetermined type that is located between the input and the array of combined amplifiers for amplifying the carrier signal to produce a predistorted carrier signal to compensate for nonlinearities introduced by the array of combined amplifiers before the carrier signal is input into the array of combined amplifiers; and
   a phase and gain adjuster for canceling a carrier signal component from the predistorted carrier signal and for inverting distortion caused by the at least one amplifier of the predetermined type to compensate for nonlinearities caused by the amplifier array.

2. The power amplifier circuit of claim 1, wherein the array of power amplifiers totals N in number, where N is a positive integer greater than 1.

3. The power amplifier circuit of claim 1, wherein all amplifiers in the array of combined amplifiers are combined in parallel with one another.

4. The power amplifier circuit of claim 1, wherein the array of combined amplifiers an array of discrete device amplifiers.

5. The power amplifier circuit of claim 1, wherein the array of combined amplifiers at least one high voltage LDMOS integrated circuit.

6. The power amplifier circuit of claim 1, wherein the at least one amplifier of the predetermined type increases efficiency and at least maintains linearity of an output of the array of combined amplifiers when compared to an output of the array of combined amplifiers without the at least one amplifier of the predetermined type that is located between the input and the array of combined amplifiers.

7. The power amplifier circuit of claim 1, further comprising an attenuator located between the input and the at least one amplifier of the predetermined type for attenuating the carrier signal before the carrier signal is predistorted by the at least one amplifier of the predetermined type.

8. The power amplifier circuit of claim 1, wherein the phase and gain adjuster further comprise:
   a carrier cancellation device for canceling the carrier signal component from the predistorted carrier signal;
   a phase adjuster for inverting a distortion signal component of the predistorted carrier signal output from the carrier cancellation device by 180° and for subsequently outputting an inverted distortion signal; and
   a combiner for combining the inverted distortion signal with a clean carrier signal component and for inputting a resulting carrier signal with inverted distortion into the array of combined amplifiers to improve linearity of an amplified carrier signal output produced by the array of combined amplifiers.

9. The power amplifier circuit of claim 8, wherein the carrier cancellation device comprises:
   a first attenuator for reducing the predistorted carrier signal by a predetermined amount upon being output from the at least one amplifier of the predetermined type;
   a second attenuator for adjusting the predistorted carrier signal prior to the predistorted carrier signal being input into the phase adjuster.

10. The power amplifier circuit of claim 1, further comprising:
    a power splitter for splitting the carrier signal into first and second signal components on first and second signal paths;
    an IQ adjuster for adjusting a phase and gain of the second signal component to produce a predistorted second signal component output from the at least one amplifier of the predetermined type;
    a carrier cancellation combiner for combining the predistorted second signal component with the first signal component to cancel the carrier signal component from the predistorted second signal component;
    an attenuator for attenuating the first signal component by a predetermined amount to produce an attenuated first signal component; and
    a carrier reinsertion combiner for combining the attenuated first signal component with a distortion signal component output from the carrier cancellation combiner.

11. The power amplifier circuit of claim 10, wherein the carrier cancellation and carrier reinsertion combiners are Wilkinson combiners.

12. The power amplifier circuit of claim 10, further comprising a delay for delaying the first signal component prior to the first signal component being input into the carrier cancellation combiner to delay match the first and second signal components.

13. The power amplifier circuit of claim 1, wherein the at least one amplifier of the predetermined type and the array of combined amplifiers are implemented in one of a wireless communications base station and a wireless handset environment.

14. A power amplifier circuit, comprising:
    a plurality of combined amplifiers for amplifying an input carrier signal;
    at least one predistortion amplifier of a type identical to that of each of the plurality of combined amplifiers for predistorting the input carrier signal and thereby outputting a predistorted carrier signal for input into the plurality of combined amplifiers to improve linearity of an output of the plurality of combined amplifiers; and
    a phase and gain adjuster for canceling a carrier signal component from the predistorted carrier signal and for inverting distortion caused by the at least one predistortion amplifier to compensate for nonlinearities caused by the amplifier array.

15. The power amplifier circuit of claim 14, wherein the plurality of combined amplifiers and the at least one predistortion amplifier each comprise at least one of a high voltage integrated circuit and a discrete device amplifier.

16. The power amplifier circuit of claim 14, wherein the at least one predistortion amplifier of a predetermined type enables the plurality of combined amplifiers to increase output power parameters while at least maintaining corresponding efficiency parameters.

17. The power amplifier circuit of claim 14, wherein the at least one predistortion amplifier of a predetermined type and the plurality of combined amplifiers are implemented in one of a wireless communications base station and a wireless handset environment.

18. A power amplifier circuit, comprising:
    a plurality of combined amplifiers for amplifying an input carrier signal; and at least one predistortion amplifier for predistorting an input signal to provide a predistorted carrier signal corresponding to the input carrier signal for input into the plurality of combined amplifiers to improve linearity of an output of the plurality of combined amplifiers, the predistortion amplifier of a type identical to that of each of the plurality of combined amplifiers with an input power level and using an amount of power that is the same as each of the combined amplifiers.

19. The power amplifier circuit of claim 18, further comprising a phase and gain adjuster for canceling a carrier signal component from the predistorted carrier signal and for inverting distortion caused by the at least one predistortion amplifier to compensate for nonlinearities caused by the plurality of combined amplifiers.

20. The power amplifier circuit of claim 18, wherein the at least one predistortion amplifier and the plurality of combined amplifiers are implemented in one of a wireless communications base station and a wireless handset.

* * * * *

UNITED STATES PATENT AND TRADEMARK OFFICE
CERTIFICATE OF CORRECTION

PATENT NO. : 6,646,505 B2
DATED : November 11, 2003
INVENTOR(S) : Dale Anderson

It is certified that error appears in the above-identified patent and that said Letters Patent is hereby corrected as shown below:

Column 7,
Line 35, after "amplifiers" insert -- comprises --.

Signed and Sealed this

Second Day of March, 2004

JON W. DUDAS
*Acting Director of the United States Patent and Trademark Office*